United States Patent [19]
Mei

[11] Patent Number: 5,501,994
[45] Date of Patent: Mar. 26, 1996

[54] EXTENDED DRAIN RESURF LATERAL DMOS DEVICES

[75] Inventor: Chia-Cu P. Mei, Plano, Tex.

[73] Assignee: Texas Instruments Incorporated, Dallas, Tex.

[21] Appl. No.: 487,763

[22] Filed: Jun. 7, 1995

Related U.S. Application Data

[63] Continuation of Ser. No. 224,948, Apr. 8, 1994.

[51] Int. Cl.⁶ .................................................. H01L 21/265
[52] U.S. Cl. ................................. 437/40; 437/7; 437/149
[58] Field of Search .................................. 437/7, 40 AS, 437/149; 148/DIG. 13, DIG. 126

[56] References Cited

U.S. PATENT DOCUMENTS

| | | | |
|---|---|---|---|
| 4,593,458 | 6/1986 | Adler | 437/40 AS |
| 5,047,358 | 9/1991 | Kosiak et al. | 437/34 |
| 5,254,487 | 10/1993 | Tamagawa | 437/34 |
| 5,306,656 | 4/1994 | Williams et al. | 437/40 AS |
| 5,328,859 | 2/1994 | Vo et al. | 437/31 |

FOREIGN PATENT DOCUMENTS

| | | |
|---|---|---|
| 0080740 | 6/1983 | European Pat. Off. . |
| 0319047 | 6/1989 | European Pat. Off. . |
| 0387999 | 9/1990 | European Pat. Off. . |
| 0386779 | 9/1990 | European Pat. Off. . |
| 0403449 | 12/1990 | European Pat. Off. . |

OTHER PUBLICATIONS

C.A.T. Salama, "Lateral Silcon Devices and High Voltage Integrated Circuits," May 1993.
Zahr Parpia and C.A.T. Salama, "Optimization of RESURF LDMOS Transistors: An Analytical Approach," IEEE Transactions on Electron Devices, vol. 37, No. 3, Mar. 1990, pp. 789–795.
Taylor Efland et al, "An Optimized RESURF LDMOS Power Device Module Compatible with Advanced Logic Processes," Texas Instrumetns Incorporated, Dec. 1992.
Professor B. Jayant Baliga, "Smart Power Technology: An Elephantine Opportunity" (Invited Plenary Session Paper), IEDM 90–3, 1990 IEEE, pp. 1.1.1–1.1.4.
Habekotte et al., "A Coplanar CMOS Power Switch," IEEE J. Solid–State Circuits, vol. SC–16, pp. 212–226, Jun. 1981.
J. A. Appels and H.JM.J. Vaes, High Voltage Thin Layer Devices (Resurf Devices), IEDM Proceedings 1979, pp. 238–241.
R. K. Williams, et al. "A DI/JI Compatible Montolith High–Voltage Multiplexer" IEE Tran on Electron Devices, vol. ED–33 #12 Dec. 1986, pp. 1977–1986.
S. Wolf; "Silicon Procession for the VLSI ERA" vol. 2; Process Integration Lattice Press, Sun Beach, CAalifornia, 1990, pp. 387–389, 536–538.

*Primary Examiner*—Chandra Chaudhari
*Attorney, Agent, or Firm*—Gerald E. Laws; Robby Holland; James C. Kesterson

[57] ABSTRACT

An integrated circuit containing high voltage PMOS and/or NMOS devices as well as low voltage PMOS and/or NMOS devices and a simple low cost method for making same that is adaptable to many types of semiconductor processes; furthermore, the breakdown voltage of the high voltage devices is easily adjusted so that the value of $R_{on}$ can be optimized. High voltage MOS devices 6 and 7 are formed on substrate 10 using essentially the same process steps as are used to form low voltage MOS devices 8 and 9. Low values of $R_{on}$ are obtained by selecting impurity concentration levels for HV drift region n-tank 21 and for HV drift region p-tank 41 so that the depletion region distance D1 bounded by equipotential lines 301a and 301j and the depletion region distance D1a bounded by equipotential lines 401a and 401h are smaller than the physical size D2 and D2a of drift regions 41 and 21, respectively.

5 Claims, 10 Drawing Sheets

EXTENDED DRAIN RESURF LATERAL DMOS DEVICES

This is a continuation of application Ser. No. 08/224,948, filed Apr. 8, 1994.

FIELD OF THE INVENTION

This invention is in the field of semiconductor integrated circuits and relates primarily to high voltage CMOS devices.

BACKGROUND OF THE INVENTION

Integrated circuits with combined control and driver functions are often referred to as smart power devices. Smart power devices combine high intelligence with low power dissipation. They typically have power Metal Oxide Semiconductor, MOS, Field Effect Transistors, FETs, in their output stages designed to operate at higher voltages, such as 15–80 volts as opposed to the normal Complementary Metal Oxide Semiconductor, CMOS, logic voltage of typically 5 volts or less, and incorporated on the same integrated circuit with logic devices so that both a driver function and a controller function are provided in a single chip. Many applications exist for smart power devices such as Liquid Crystal Display, LCD, displays, electro/mechanical devices, automobile electronic devices, projection TV, and even High Definition, HDTV.

A technique for fabricating high voltage, HV, MOS devices is described in an article entitled "High Voltage Thin Layer Devices (RESURF Devices)," IEDM Proceedings, 1979, pp 238–241. This technique uses a shallow lightly doped region between the drain and channel regions of the device. This shallow lightly doped region is referred to as a drift region because of the low amount of current carriers (carriers being electrons or "holes") that are available due to the low level of impurity doping and the device is known as a Reduced Surface Field, RESURF, device.

RESURF techniques are utilized in manufacturing high voltage N-channel Lateral Double Diffused MOS, LDMOS, devices and high voltage, P-channel LDMOS, devices. However, problems exist in manufacturing smart power devices containing such RESURF LDMOS devices. Conventional high voltage power devices typically employ double twin-well (tank) implants in order optimize the high voltage N-channel, HV NMOS, and high voltage P-channel, HV PMOS, devices. FIG. 1 is a cross-sectional view illustrating a typical smart power device manufactured by such double twin well implant process. High voltage devices HV NMOS 6 and HV PMOS 7 and low voltage devices LV NMOS 8 and LV PMOS 9 lie on n-type substrate 10. HV NMOS 6 has an n-tank 21 lying within a p-well 20 and a D-well 28 and 28a lying within p-well 20 and adjacent to n-tank 21. HV PMOS 7 has a p-tank 41 lying within an n-well 40 and a D-well 48 and 48a lying within n-well 40 and adjacent to p-tank 41. LV NMOS 8 has a p-well 60 and LV PMOS 9 has an n-well 80. In a conventional double twin-well (tank) process, n-tank 21 and D-well 48 and p-tank 41 and D-well 28 typically require compromised cross optimized process steps that are different from the process steps used to form wells 60 and 80 of low voltage CMOS devices 8 and 9. Separate implant steps and diffusion steps are required.

The double twin-well implant process undesirably requires multiple cross process steps to optimize the electrical parameters of the N-channel and P-channel high voltage devices while maintaining the parameters of the low voltage CMOS devices. Fabricating an integrated circuit containing standard low voltage CMOS devices and high voltage PMOS and NMOS devices typically requires many extra process steps for the HV PMOS and HV NMOS devices.

It is accordingly an object of the invention to provide a simple method to manufacture smart power devices.

It is also an object of the invention to eliminate process steps required to manufacture low power MOS devices and high power MOS devices on the same integrated circuit.

Other objects and advantages will be apparent to those of ordinary skill in the art having reference to the following figures and specification.

SUMMARY OF THE INVENTION

In contrast to prior art techniques of forming high voltage power devices employing double twin-well (tank) implants, the present invention uses a double single-well process with a drift region in an HV PMOS and/or an HV NMOS device in forming RESURF LDMOS high voltage devices simply and compatibly with CMOS low power devices.

BRIEF DESCRIPTION OF THE DRAWINGS

Corresponding numerals and symbols in the different figures refer to corresponding parts unless otherwise indicated.

DESCRIPTION OF THE PREFERRED EMBODIMENT OF THE INVENTION

Figure 1:
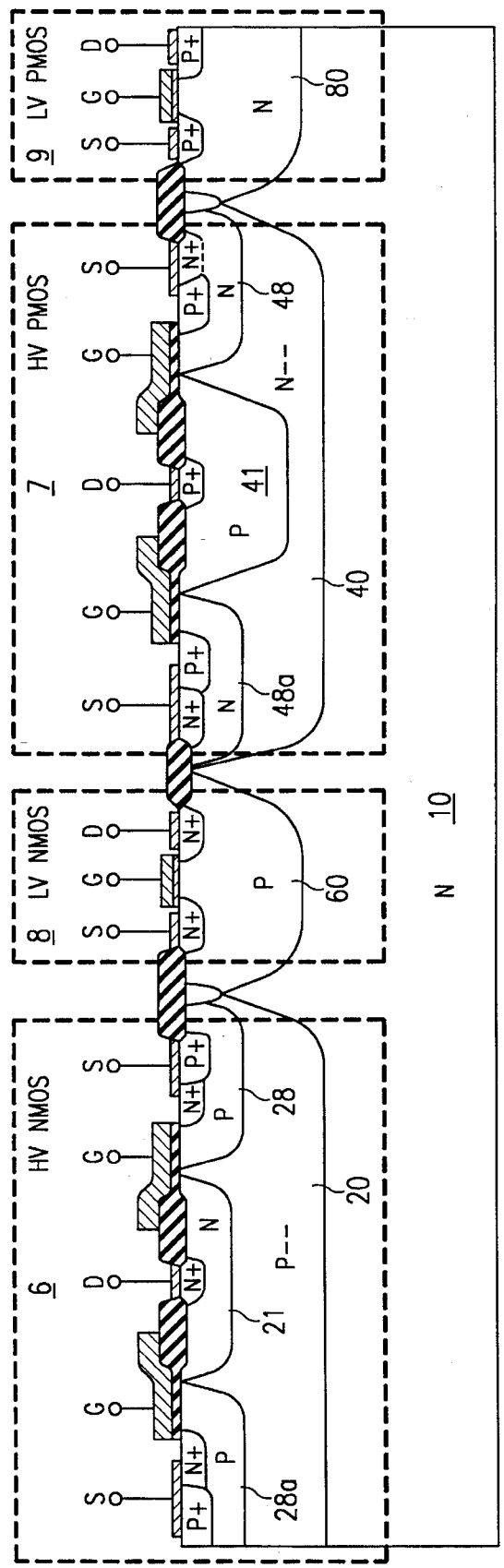
FIG. 1 is a cross-sectional view of an integrated circuit illustrating an HV NMOS device, an HV PMOS device, an LV NMOS device and an LV PMOS device on the same substrate made using conventional techniques.

A preferred embodiment of the invention is now described. Table A contains a listing of element names and reference numbers used in the drawings, while Table B provides the function, a specific embodiment and alternate examples of various elements. Tables A and B are incorporated herein and made a part of this specification.

Figure 2:
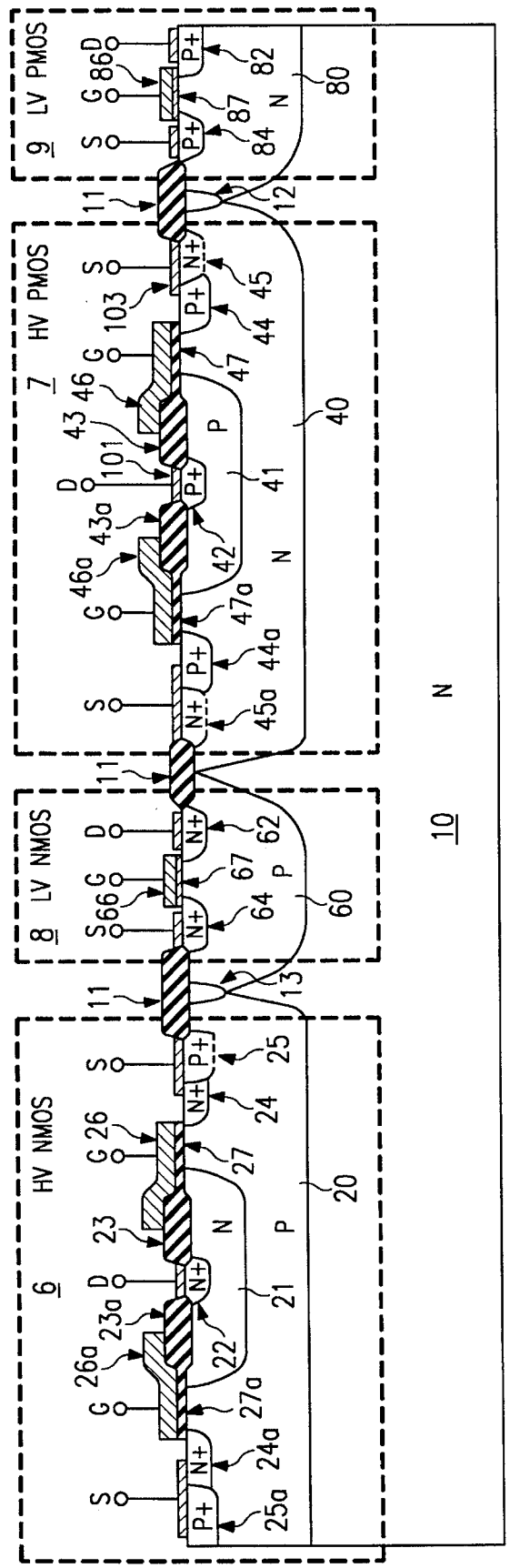
FIG. 2 is a cross-sectional view of an integrated circuit illustrating an HV NMOS device, an HV PMOS device, an LV NMOS device and an LV PMOS device formed on the same substrate in accordance with the present invention.

FIG. 2, shows a cross-sectional view of an integrated circuit formed in accordance with the invention containing an HV NMOS device 6, an HV PMOS device 7, an LV NMOS device 8 and an LV PMOS device 9. Each device is formed in a well which isolates it from the substrate. Substrate 10 is n-type silicon with a high resistivity of approximately 8–12 Ohm-cm.

In FIG. 2, HV NMOS device 6 has an n-tank 21 lying within a p-well 20. Tank 21 provides a RESURF drift region. HV drain 22 is formed within n-tank 21. HV source 24 is formed within p-well 20 and is separated from drain 22 by HV gate oxide 27 and HV field oxide 23. HV p-well contact 25 is formed within p-well 20. HV gate electrode 26 overlays gate oxide 27 and field oxide 23. An optional mirror image gate and source is shown consisting of HV source 24a formed within p-well 20 and separated from drain 22 by HV gate oxide 27a and HV field oxide 23a, HV p-well contact 25a formed within p-well 20, and HV gate electrode 26a overlaying gate oxide 27a and field oxide 23a.

In FIG. 2, HV PMOS device 7 has a p-tank 41 lying within an n-well 40. Tank 41 provides a RESURF drift region. HV drain 42 is formed within p-tank 41. HV source 44 is formed within n-well 40 and is separated from drain 42 by HV gate oxide 47 and HV field oxide 43. HV n-well contact 45 is formed within n-well 40. HV gate electrode 46 overlays gate oxide 47 and field oxide 43. As for HV NMOS device 6, an optional mirror image gate and source is shown consisting of HV source 44a formed within n-well 40 and separated from drain 42 by HV gate oxide 47a and HV field oxide 43a, HV n-well contact 45a formed within n-well 40, and HV gate electrode 46a overlaying gate oxide 47a and field oxide 43a.

In FIG. 2, LV NMOS 8 a has p-well 60. LV drain 62 and LV source 64 are formed in p-well 60 and separated by gate oxide 67. LV gate electrode 66 overlays gate oxide 67. LV PMOS device 9 has an n-well 80. LV drain 84 and LV source 82 are formed in n-well 80 and separated by gate oxide 87. LV gate electrode 86 overlays gate oxide 87.

Still referring to FIG. 2, and according to the present invention, p-wells 20 and 60 can be implanted in a single step with boron, for example, and n-wells 40 and 80 can be implanted in a single step with arsenic or phosphorous, for example. Implanting boron to form a concentration of approximately $2.0e16/cm^3$ after diffusion is sufficient for p-wells 20 and 60. Implanting phosphorous at about the same concentration level is sufficient for n-wells 40 and 80. After implanting the wells, only a single diffusion step is needed to drive the dopants. Thus, the p-wells 20 and 60 of the HV NMOS device 6 and the LV NMOS device 8 are implanted simultaneously. Likewise, the n-wells 40 and 80 of the HV PMOS device 7 and the LV PMOS device 9 are implanted simultaneously. The wells 20, 40, 60 and 80 may all be driven to about the same depth by a single diffusion step.

Still referring to FIG. 2 and according with the invention, drift region n-tank 21 can be implanted with phosphorous or arsenic, for example, and optimized for the HV NMOS device 6, and drift region p-tank 41 can be implanted with boron, for example, and optimized for the HV PMOS device 7. Implanting boron to form a concentration of approximately $8.0e16/cm^3$ after diffusion is sufficient for drift region p-tank 41. Implanting phosphorous to form a concentration of approximately $3.0e16/cm^3$ after diffusion is sufficient for drift region n-tank 21. Thus the two drift region tanks 21 and 41 within the two single wells 20 and 40 (double single wells) may be advantageously optimized for HV NMOS device 6 and HV PMOS device 7, respectively.

Figure 3A:
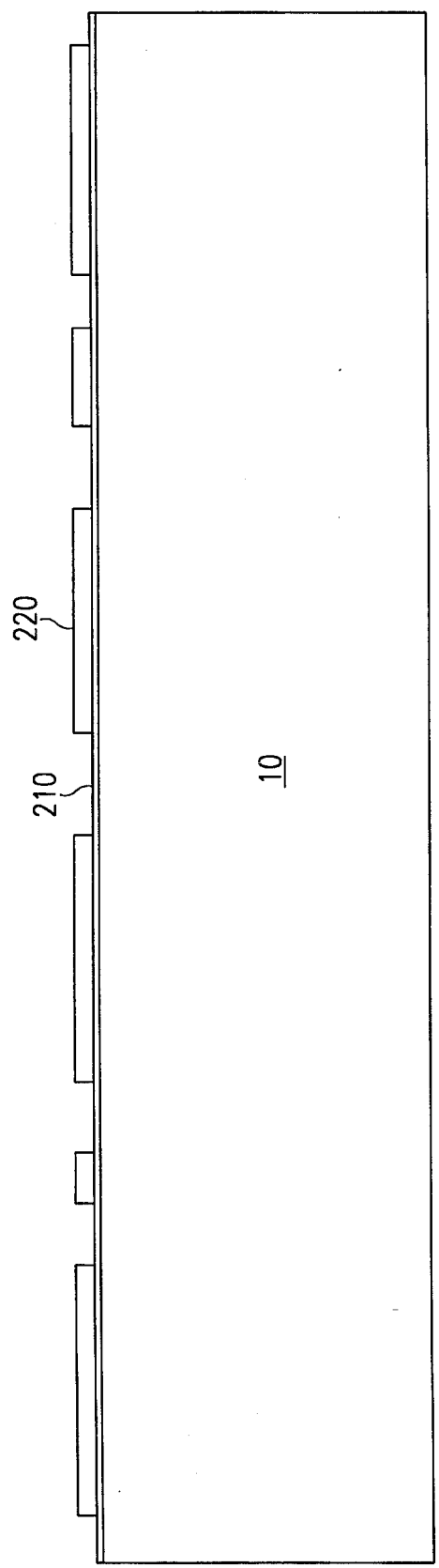
FIGS. 3A–3N are cross-sectional views illustrating the preferred method of constructing an integrated circuit in accordance with the present invention.
Figure 3B:
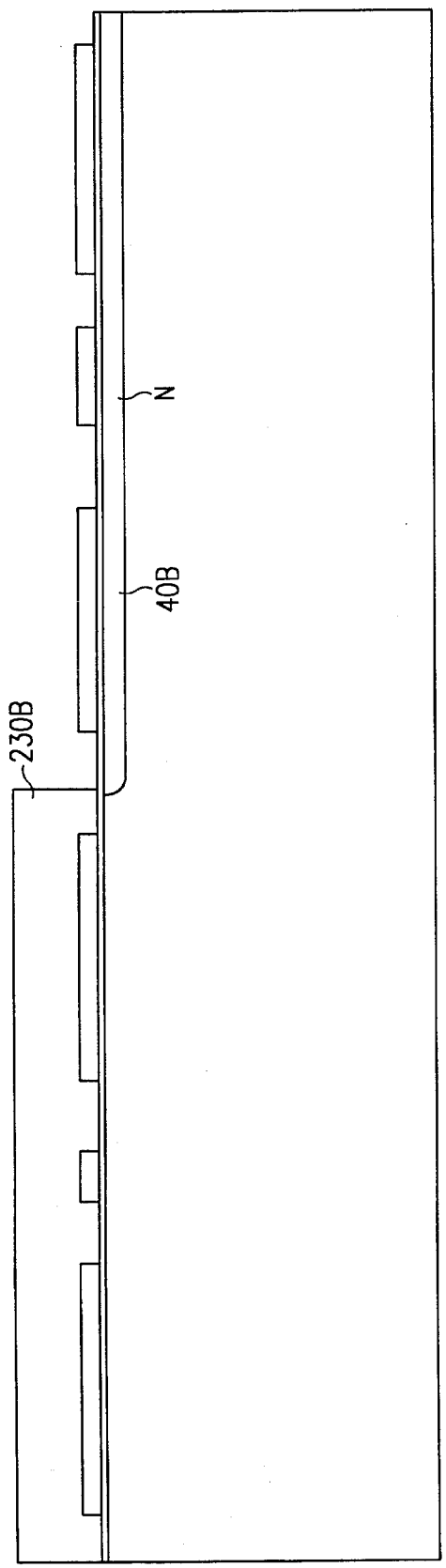
Figure 3C:
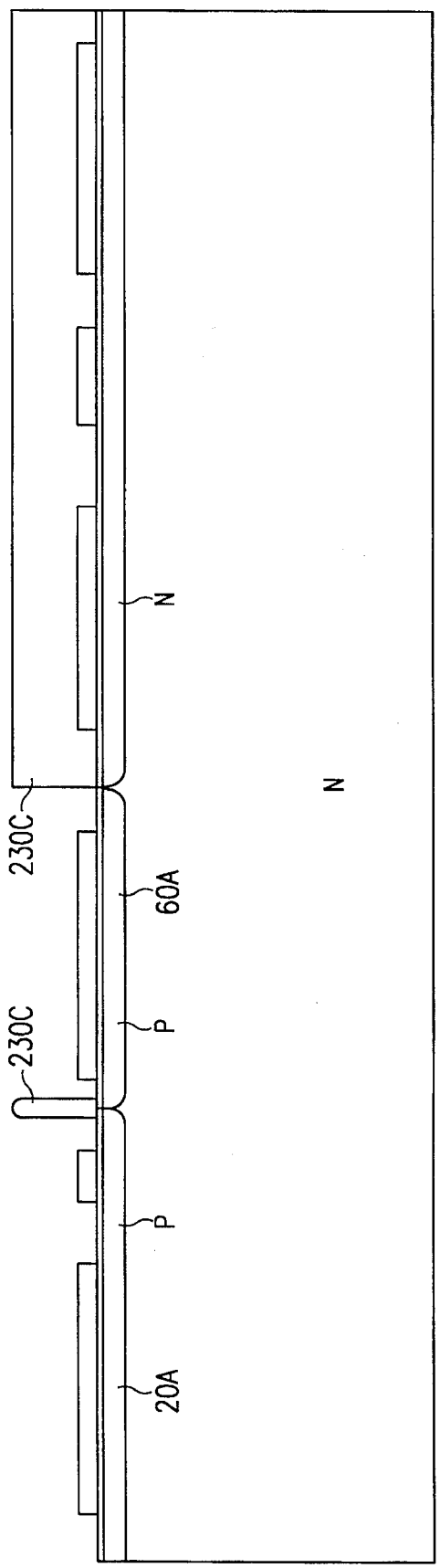
Figure 3D:
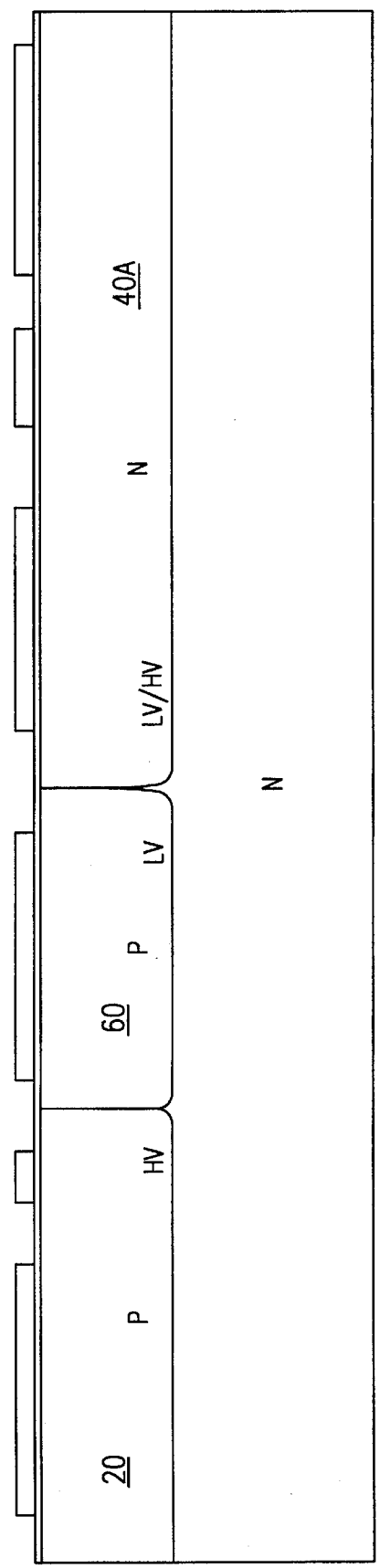
Figure 3E:
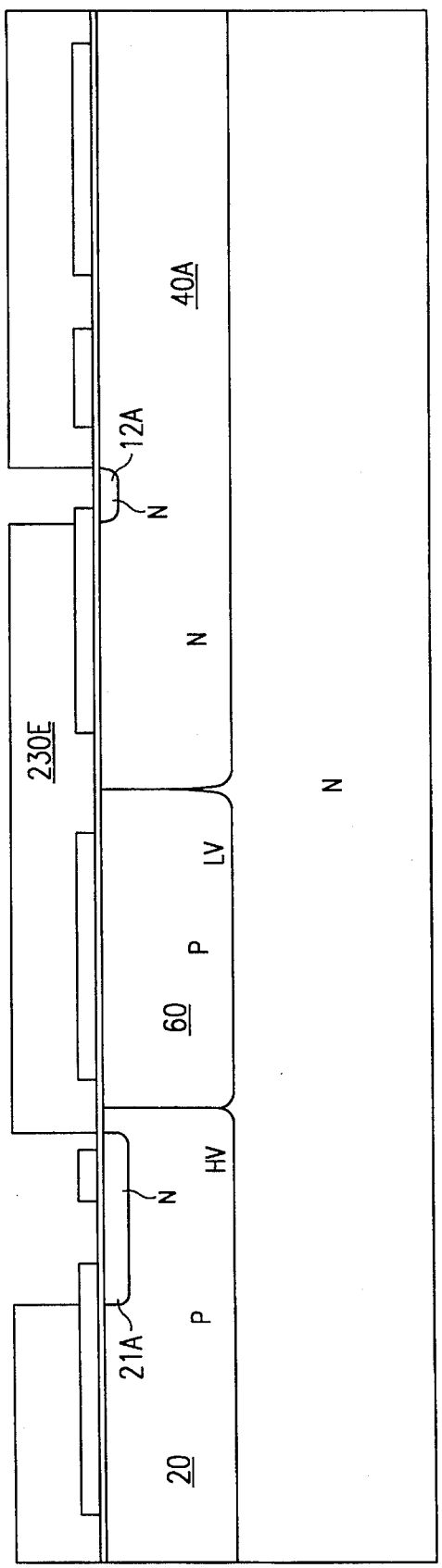
Figure 3F:
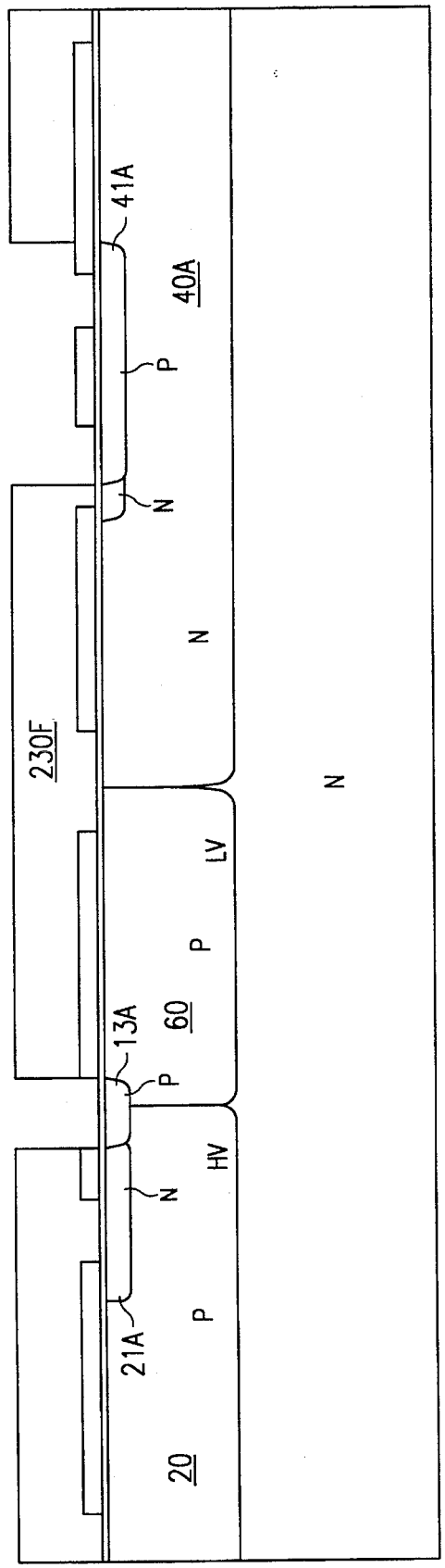
Figure 3G:
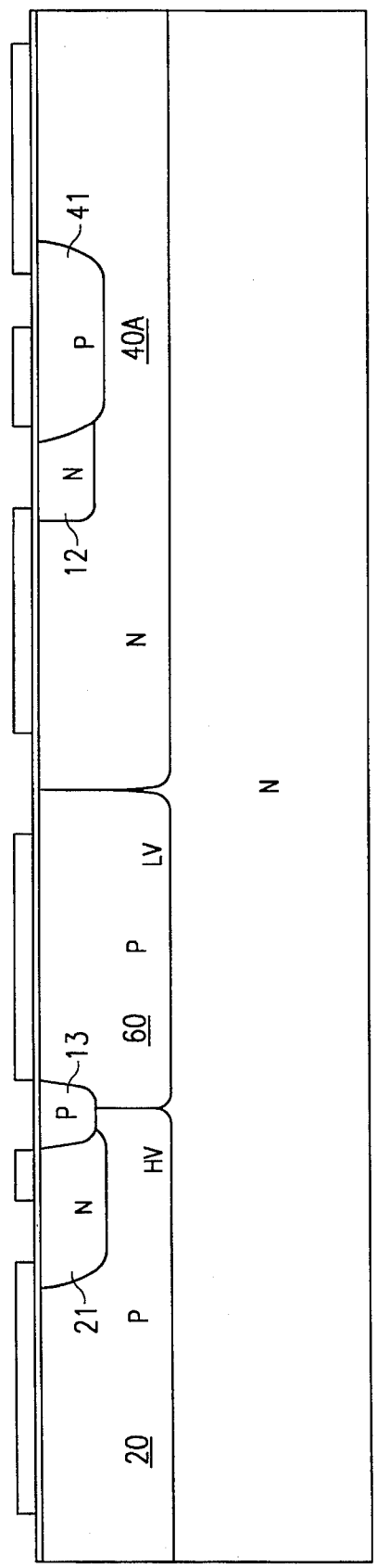
Figure 3H:
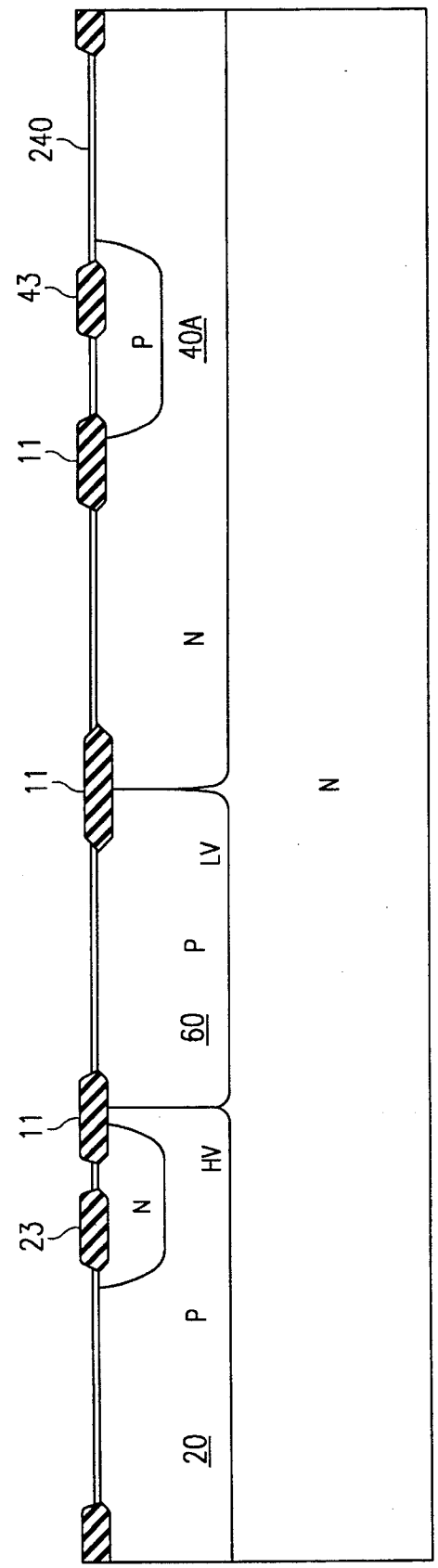
Figure 3I:
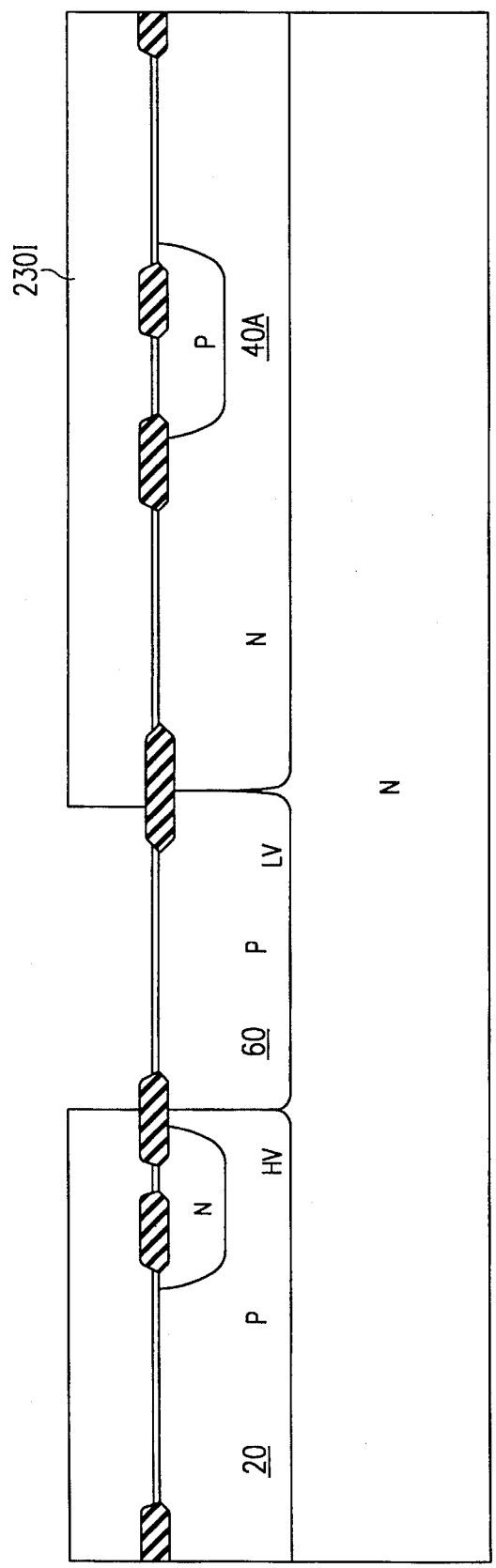
Figure 3J:
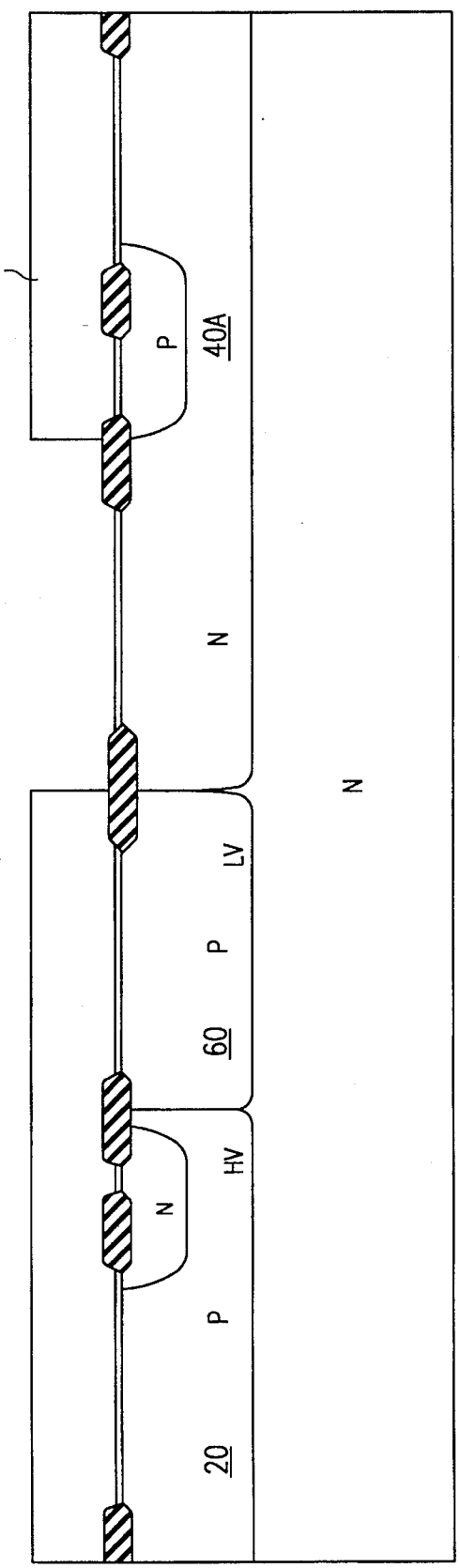
Figure 3K:
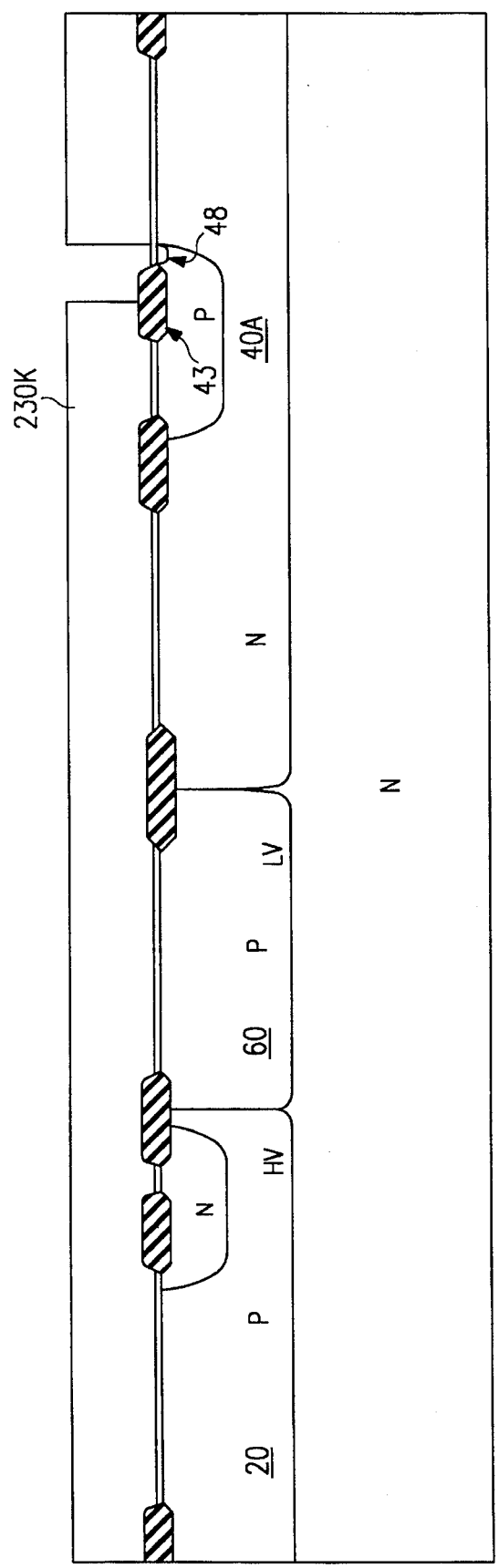
Figure 3L:
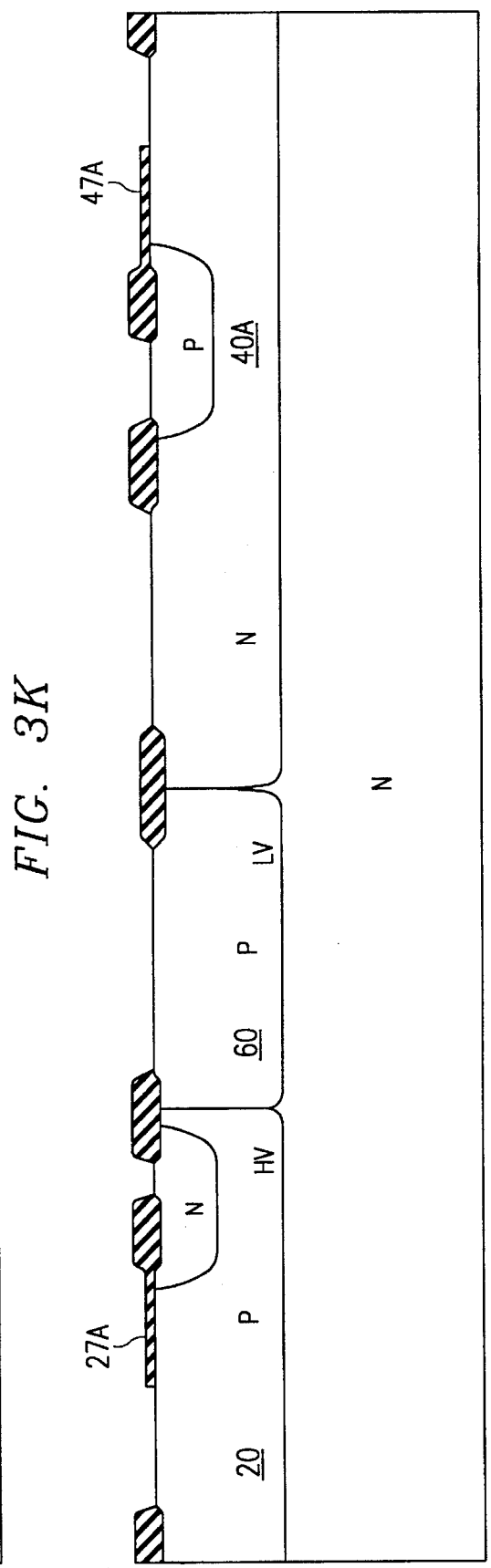
Figure 3M:
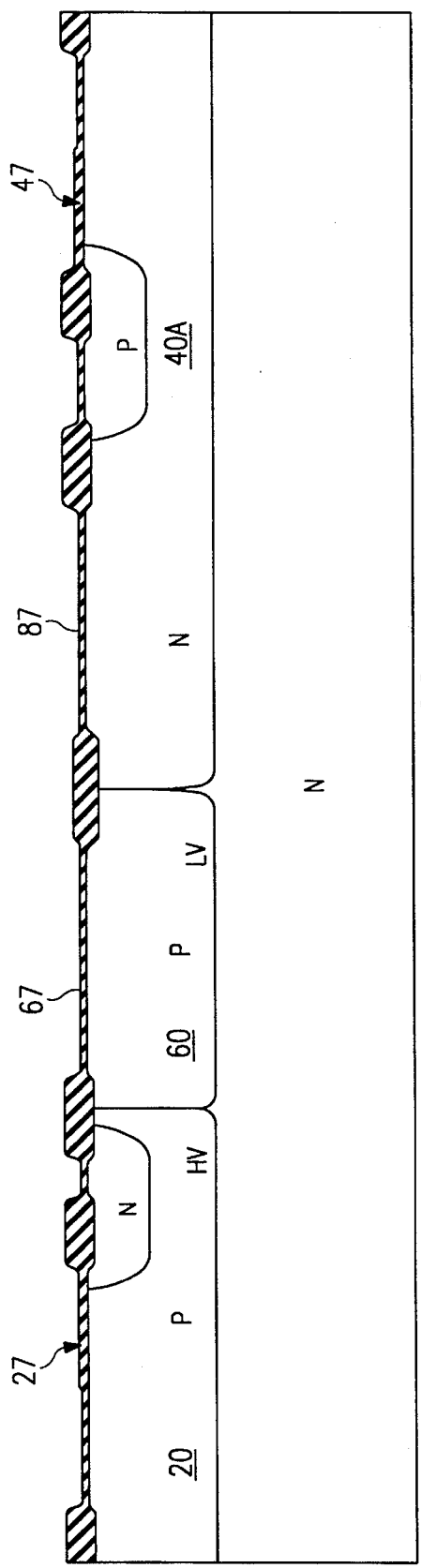
Figure 3N:
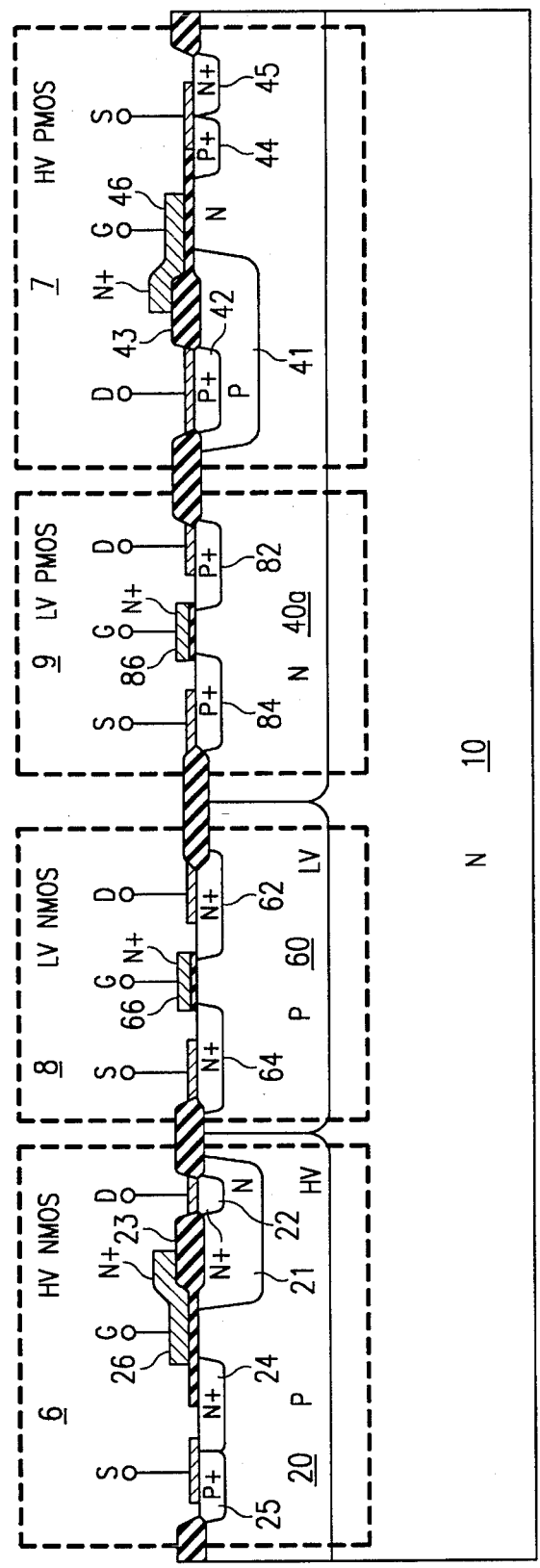

Referring now to FIG. 3A–3N, a preferred process for forming the device shown in FIG. 2 is described. It is to be noted, however, that the following figures show PMOS devices 7 and 9 formed in the same well 40A as opposed to separate wells 40 and 80 shown in FIG. 2. The FIGS. 3A–3N additionally show HV NMOS device 6 as a single-sided device as opposed to the double-sided device shown in FIG. 2, and the FIGS. 3A–3N show the low voltage devices 8 and 9 residing next to each other and between HV devices 6 and 7 as opposed to the layout of FIG. 2.

FIG. 3A shows n type substrate 10 on which a layer of 1st oxide 210 is grown. Nitride 220 is deposited on top of the 1st oxide and then masked and etched.

FIG. 3B shows n-type dopant 40B after implantation. Photoresist 230B blocks the dopant 40B from undesired insertion. The implant occurs through oxide layer 210 and nitride layer 220. Dopant 40B is used to form tank 40A.

FIG. 3C shows p-type dopant 20A and 60A after implantation. Photoresist 230C masks the dopant 20A and 60A from undesired insertion. The same dopant is used for 20A and 60A with only one implant step occurring. The regions 20A and 60A being used to form corresponding tanks 20 and 60.

FIG. 3D shows the result of a single diffusion step which causes n-type dopant 40B and p-type dopant 20A and 60A to form HV p-well 20, LV p-well 60, and LV/HV n-well 40A. The diffusion drives the dopants all wells into substrate 10 to about the same depth, of approximately 8 um.

FIG. 3E shows n-type dopant 12A and 21A after being implanted through a pattern formed by photoresist 230E. Dopant 21A is within HV p-well 20. The concentration of dopant 21A is selected to minimize the on resistance of HV NMOS device 6, as will be explained later.

FIG. 3F shows p-type implant 13A and 41A after being implanted through a pattern formed by photoresist 230F. Dopant 41A is within n-well 40A. The concentration of dopant 41A is selected to minimize the on resistance of HV PMOS device 7, as will be explained later.

FIG. 3G shows the result of a single diffusion step that forms HV drift region n-tank 21, HV drift region p-tank 41, n-channel stop 12 and p-channel stop 13. The drift region depth is limited to about 1–2 um so that when a depletion region is formed in drift region 21 and 41 in response to the application of a source to drain voltage ($V_{ds}$), the resulting field will impinge on the surface of the device and thereby reduce the voltage gradient on the surface, according to the well known operation of a RESURF device.

With respect to FIG. 3E, it should be noted that n-channel stop 12 or p- channel stop 13 does not need to be between every device. As is known, channel stop 12 and 13 may be placed between devices as needed when there could be a likelihood of spurious channel development due to fields from interconnect conductors. The channel stops may be omitted when not needed. For clarity, channel stops 12 and 13 are not shown in the remaining process steps.

It should be noted that with respect to FIGS. 3A–3G, the formation of HV wells 20 and 40A and HV drift region tanks 21 and 41 advantageously did not require more additional process steps than those used to form the low voltage CMOS devices.

FIG. 3H shows field oxide 11, HV NMOS field oxide 23, and HV PMOS field oxide 43 that are grown thermally on areas which are not covered with nitride 220. After oxide growth, nitride 220 is removed. Dummy oxide 240 is then grown over the exposed areas.

FIG. 3I shows the photoresist pattern 230I for implanting an n-type channel adjust into p-well 60. The known technique of a channel adjustment implant optimizes the threshold voltage of CMOS device 8. The threshold of HV NMOS device 6 can also be optimized in this same step, if desired, by appropriately patterning the overlying photoresist.

FIG. 3J shows the photoresist pattern 230J for implanting p-type channel adjust into n-well 40A. The channel adjust implant optimizes the threshold voltage of CMOS device 9. The threshold of HV NMOS device 7 can also be optimized in this same step, if desired, by appropriately patterning the overlying photoresist.

FIG. 3K shows p-type dopant 48 after implantation. Photoresist 230K blocks the dopant 48 from undesired insertion. P-type dopant 48 replaces boron that was lost during the formation of field oxide 43.

FIG. 3L shows partial HV gate oxide 27A and 47A which is formed by depositing oxide over the integrated circuit, patterning, and etching the oxide layer. The thickness of this oxide layer is selected so that the oxide added in a following step will combine to create the target thickness for HV gate oxide 27 and 47, as shown in FIG. 3M. Partial HV gate oxide 27A and 47A may be 800 Å thick, for example.

FIG. 3M shows LV gate oxide 67 and 87 and complete HV gate oxide 27 and 47 which is formed by depositing oxide over the entire integrated circuit.

In FIG. 3N, polysilicon has been deposited and etched to form HV gate electrode 26 and 46, and LV gate electrode 66 and 86. HV n+ drain 22, HV n+ source 24, n+ contact 45, LV n+ drain 62 and LV n+ source 64 can thereafter be implanted in a single implant step. Likewise, p+ contact 25, HV p+ drain 42, HV p+ source 44, LV p+ drain 82 and LV p+ source 84 can be implanted in a single implant step. All of the drain and source elements (22, 24, 25, 42, 44, 45, 62, 64, 82 and 84) can then be diffused in a single diffusion step to approximately the same depth, thus yielding the device of FIG. 2 except for the single tank 40A instead of tanks 40 and 80 as previously explained.

Referring again to FIG. 3N and comparing FIG. 2, it is shown that high voltage devices and low voltage devices may be formed in the same or separate wells. In FIG. 2, HV PMOS device 7 and LV PMOS device 9 are shown in separate n-wells, 40 and 80. In FIG. 3N, HV PMOS device 7 and LV PMOS device 9 are both shown in the same n-well 40A.

Well known steps can then be followed to complete the integrated circuit.

Figure 4:
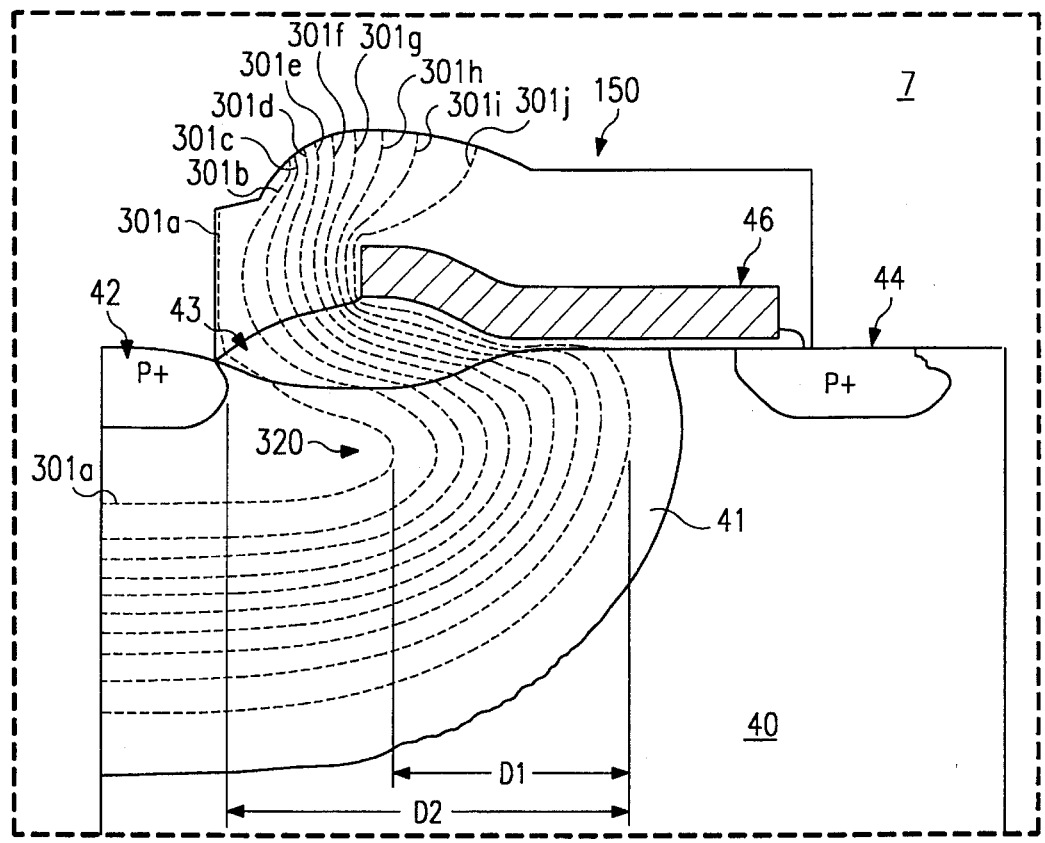
FIG. 4 is a cross-sectional view of an HV PMOS device showing the electric field equipotential lines and the extended drain region.

Referring to FIG. 4, another aspect of the present invention will be described. In normal operation of HV PMOS device 7, a drain to source voltage, $V_{ds}$, is applied across p+ source 44 and p+ drain 42. HV p+ source 44 and HV n-well 40 is typically positive with respect HV p+ drain 42. A gate voltage is connected to HV PMOS gate electrode 46. The gate voltage ($V_{gs}$) is typically maintained at a value within the range of about $0 - V_{ds}$ with respect to HV source 44. A depletion region is formed in HV drift region p-tank 41 and a voltage field gradient occurs in drift region 41, HV field oxide 43, and interlevel oxide 150. Equipotential lines 301A to 301J indicate how the voltage field is arranged. Within the drift region 41, equipotential line 301A approximately defines the lower voltage (i.e., less positive) edge of the depletion region and equipotential line 301J approximately defines the higher voltage (i.e., more positive) edge of the depletion region. The drain to source voltage across HV PMOS device 7, and hence the depletion region, is typically maximum when the device is turned off.

Still referring to FIG. 4, for HV PMOS devices designed to operate in the range of approximately 15–80 volts, the minimum required distance between equipotential line 301A and equipotential line 301J, D1, to avoid voltage breakdown is smaller than the physical distance D2 between drain 42 and the edge of drift region 41 when HV PMOS device 7 is fabricated on equipment using 1.8–2.0 um design rules. According to the present invention, it has been discovered that the impurity concentration of the drift region can be raised to a higher level then used in prior RESURF devices.

As the impurity concentration is raised, the resistivity of drift region 41 falls, but the distance over which the depletion region extends decreases.

Still referring to FIG. 4, the distance D1 over which the depletion region extends can be decreased until the region is not substantially larger than needed to withstand the breakdown voltage that the device is designed to withstand. The effect of raising the impurity concentration in the drift region is to reduce the distance D1 over which the depletion region extends and to form the extended drain region 320 in the drift region. Since the resistivity of the drift region 41 is a significant component of on resistance, $R_{on}$, $R_{on}$ is minimized by selecting an impurity concentration for drift region 41 that is as large as possible. HV PMOS devices with alternate breakdown voltages may be constructed, as indicated in table B. Boron concentration ranging from about $1.0e16/cm^3$ to about $3.0e17/cm^3$ at a depth ranging from about 1.0 um to about to about 2.5 um yields a minimal drift region for HV PMOS device 7 having a breakdown voltage ranging from about 15 volts to approximately 80 volts. Experiments have determined that an HV PMOS device with a breakdown voltage of about 44 V and a specific on-resistivity of about 1.8 Mohm-$cm^2$ can be obtained with a drift region impurity concentration of approximately $8.0e16/cm^3$.

Figure 5:
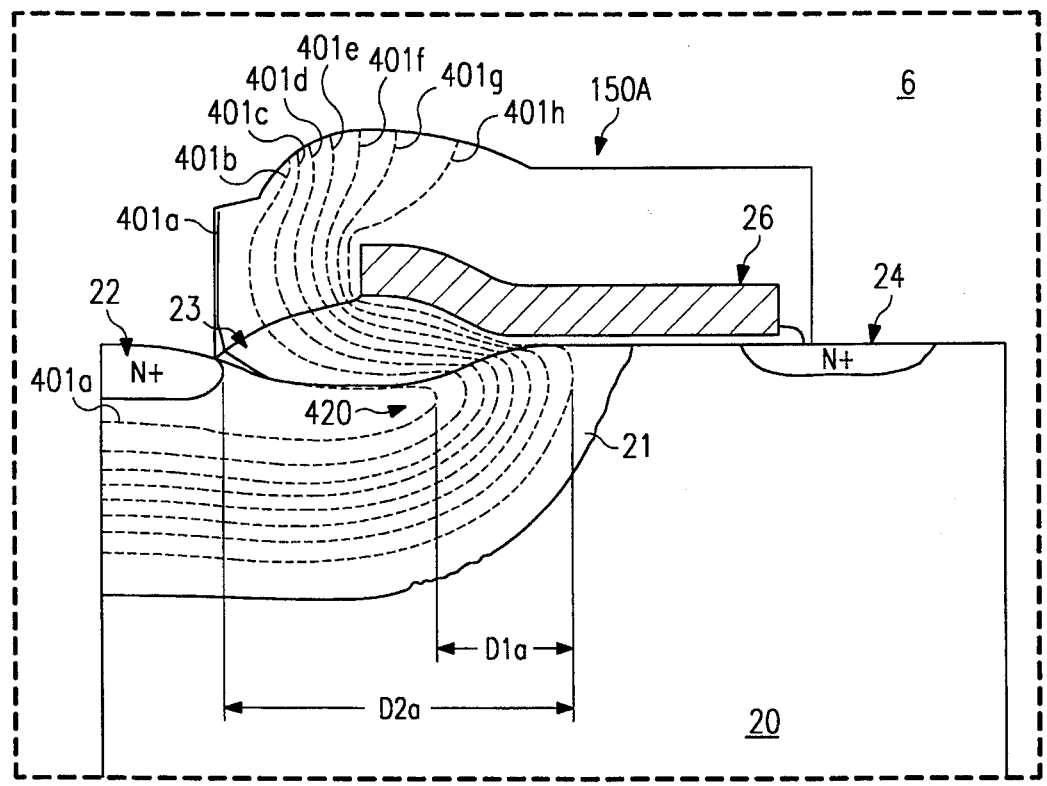
FIG. 5 is a cross-sectional view of an HV NMOS device showing the electric field equipotential lines and the extended drain region.

Referring to FIG. 5, the application of the present invention to HV NMOS device 6 is described. Equipotential line 401A approximately defines the higher voltage (i.e., more positive) edge of the depletion region and equipotential line 401H approximately defines the lower voltage (i.e., less positive) edge of the depletion region. $R_{on}$ for HV NMOS device is minimized as described in the prior paragraph by raising the impurity level of HV drift region 21 until the distance D1a over which the depletion extends is decreased to form extended drain 420 until distance D1a is not significantly larger than needed to withstand the breakdown voltage that the device is designed to withstand.

Experiments have shown that an NMOS device with a breakdown voltage of about 40 V and a specific on-resistivity of 0.7 Mohm-$cm^2$ can be obtained with a drift region impurity concentration of $3.0e17/cm^3$. Alternate concentration ranges are contained in Table B.

The invention provides many advantages. It allows the use of older process equipment to make smart power integrated circuits that have a larger number of high voltage devices than was feasible in the past.

It has been found that by carefully controlling the impurity concentration and depth of the drift region in a reduced surface field LDMOS device, high voltage PMOS and NMOS devices can be constructed using essentially the same process steps as are used to construct the low voltage logic devices. It has also been found that, for devices that are designed to operate at drain to source voltages ($V_{ds}$) of less than approximately 60 volts, by increasing the impurity concentration of the drift region above the levels used on prior RESURF devices, the on resistance ($R_{ds(on)}$) is reduced significantly from prior RESURF devices that do not use this feature. The breakdown voltage of the high voltage device is adjusted to optimize $R_{ds(on)}$.

An advantage of the current invention is that a simple process that is adaptable to most CMOS fabrication processes allows the high voltage PMOS devices and the high voltage NMOS devices to optimized independently so that $R_{ds(on)}$ of each is minimized.

Another advantage of the present invention is that it teaches a method of adjusting the breakdown voltage of the high voltage devices in an integrated circuit that contains both low voltage and high voltage devices so that the on resistance of the high voltage devices is minimized.

Another advantage of the current invention is simplified processing by implanting n-wells 20 and 60 in a single step, implanting p-wells 40 and 80 in a single step, and diffusing the wells for the low voltage and high voltage devices simultaneously.

A further advantage of the current invention is that drift region 21 can be implanted in the same step as channel stop 12 and drift region 41 can be implanted in the same step as channel stop 13 and a single diffusion step can form drift region 21 and 41 and channel stop 12 and 13. During these steps, the concentration of drift region 21 and drift region 41 can be optimized, since channel stop 12 and 13 concentrations are not critical.

While the invention has been described with reference to illustrative embodiments, this description is not intended to be construed in a limiting sense. Various other embodiments of the invention will be apparent to persons skilled in the art upon reference to this description. For example, a non-exclusive set of alternate examples of various elements are given in Table B. An alternate embodiment may use either N or P type substrate 10 since all devices are isolated by the wells 20, 40, 60, and 80. It is therefore contemplated that the appended claims will cover any such modifications of the embodiments as fall within the true scope and spirit of the invention.

TABLE A

| Element | Element Name |
|---|---|
| 6 | HV NMOS device |
| 7 | HV PMOS device |
| 8 | LV NMOS device |
| 9 | LV PMOS device |
| 10 | substrate |
| 11 | field oxide |
| 12 | n-channel stop |
| 13 | p-channel stop |
| 20 | HV p-well |
| 21 | HV drift region (n)-tank |
| 22 | HV n+ drain |
| 23 | HV NMOS field oxide |
| 24, 24a | HV n+ source |
| 25, 25a | HV p+ p-well contact region |
| 26, 26a | HV NMOS gate electrode |
| 27 | HV NMOS gate oxide |
| 40 | HV n-well |
| 41 | HV drift region (p)-tank |
| 42 | HV p+ drain |
| 43 | HV PMOS field oxide |
| 44, 44a | HV p+ source |
| 45, 45a | HV n+ n-well contact region |
| 46, 46a | HV PMOS gate electrode |
| 47 | HV PMOS gate oxide |
| 48 | HV PMOS drift region rim adjustment |
| 60 | LV p-well |
| 62 | LV n+ drain |
| 64 | LV n+ source |
| 66 | LV NMOS gate electrode |
| 67 | LV NMOS gate oxide |
| 80 | LV n-well |
| 82 | LV p+ drain |
| 84 | LV p+ source |
| 86 | LV PMOS qate electrode |
| 87 | LV PMOS gate oxide |
| 101 | HV drain electrode |
| 103 | HV source electrode |
| 150 | interlevel oxide |
| 210 | 1st oxide |
| 220 | nitride |

TABLE A-continued

| Element | Element Name |
|---|---|
| 230 | photoresist |
| 240 | dummy oxide |
| 301A–301J | PMOS equipotential line |
| 320 | PMOS extended drain |
| 401A–401H | NMOS equipotential line |
| 420 | NMOS extended drain |

TABLE B

| Element | Function | Specific embodiment HVNMOS rated breakdown = 30 v. HVPMOS rated breakdown = 30 v. | Alternate examples HV breakdown = approx 15–80 v. |
|---|---|---|---|
| 10 | substrate | 8–12 Ohm-cm (n–) Si | 8–12 Ohm-cm (p–) Si |
| 11 | isolation between devices | thermal Si oxide, approx 9300Å thick | |
| 12 | prohibit spurious channel development | formed (p+), approx 2 um deep | |
| 13 | prohibit spurious channel development | formed (n+), approx 2 um deep | |
| 20 | localized semiconductive substrate well | formed (p), approx 2.0e16/cm$^3$, approx 8 um deep | approx 1.0e15–5.0e16/cm$^3$, approx 4.0–10.0 um deep |
| 21 | drain depletion region to reduce the surface field | formed (n), approx 3.0e17/cm$^3$ approx 1.1 um deep | approx 5.0e16–5.0 e17/cm$^3$ approx 1.0–2.5 um deep |
| 22 | highly conductive drain contact region | formed (n+), approx 1.0e19/cm$^3$, approx 0.5 um deep | |
| 23 | insulate gate from drain and drift region | thermal Si oxide, approx 9700Å thick | |
| 24 | source region | formed (n+), approx 1.0e19/cm$^3$, approx 0.5 um deep | |
| 25 | highly conductive tank contact region | formed (p+), approx 1.0e19/cm$^3$, approx 0.5 um deep | |
| 26 | gate electrode | poly Si | metal, such as Al, Cu |
| 27 | insulate gate electrode from conductive regions | Si oxide, approximately 1000Å | |
| 40 | localized semiconductive substrate well | formed (n), approx 1.5e16/cm$^3$ approx 8 um deep | approx 1.0e15–5.0 e16/cm$^3$ approx 4.0–10 um deep |
| 41 | drain depletion region to reduce the surface field | formed boron (p), approx 8.0e16/cm$^3$, approx 1.1 um deep | approx 0.1–3.0 e17/cm$^3$ approx 1.0–2.5 um |
| 42 | highly conductive drain contact region | formed (p+), approx 1.0e19/cm$^3$, approx 0.5 um deep | |
| 43 | insulate gate from drain and drift region | thermal Si oxide, approx 9300Å | |
| 44 | source region | formed (p+), approx 1.0e19/cm$^3$, approx 0.5 um deep | |

TABLE B-continued

| Element | Function | Specific embodiment examples HVNMOS rated breakdown = 30 v. HVPMOS rated breakdown = 30 v. | Alternate examples HV breakdown = approx 15–80 v. |
|---|---|---|---|
| 45 | highly conductive tank contact region | formed (n+), approx 1.0e19/cm³, approx 0.5 um deep | |
| 46 | gate electrode | poly Si | metal, such as Al, Cu |
| 47 | insulate gate from conductive regions | deposited Si oxide, aprox 1000Å | |
| 48 | replace depleted boron | formed boron, approx 1.0e13/cm³ | approx 0.5–1.5e13/cm³ |
| 60 | localized semiconductive substrate well | formed (p), approx 2.0e16/cm³ | approx 1.0e15–5.0e16/cm³, approx 4.0–10.0 um deep |
| 62 | drain region | formed (n+), approx 1.0e19/cm³, approx 0.5 um deep | |
| 64 | source region | formed (n+), approx 1.0e19/cm³, approx 0.5 um deep | |
| 66 | gate electrode | poly Si | metal, such as Al, Cu |
| 67 | insulate gate electrode | deposited Si oxide, approx 350Å | |
| 80 | localized semiconductive substrate well | formed (n), approx 1.5e16/cm³ | approx 1.0e15–5.0 e16/cm³ approx 4.0–10 um deep |
| 82 | drain region | formed (p+), approx 1.0e19/cm³, approx 0.5 um deep | |
| 84 | source region | formed (n+), approx 1.0e19/cm³, approx 0.5 um deep | |
| 86 | gate electrode | poly Si | metal, such as Al, Cu |
| 87 | insulate gate electrode | Si oxide, approx 350Å | |
| 101 | drain electrode | poly Si | a) metal, such as Al, Cu b) refractory metal silicide |
| 103 | source electrode | poly Si | a) metal, such as Al, Cu b) refractory metal silicide |
| 150 | insulate conductive layers | Si oxide | |
| 210 | etch stop for nitride, protect crystal surface | thermal oxide, approx 400Å | |
| 220 | mask for field oxide | deposited Si₃N₄, approx 1200Å | |
| 230 | mask for implants | | |
| 240 | protect crystal surface | thermal oxide, approx 400Å | |
| 301A–301J | equipotential lines | 5 volt steps | |
| 320 | minimize total source to drain resistance | optimize drift region doping to minimize drain depletion region | |
| 401A–401J | equipotential lines | 5 volts steps | |
| 420 | minimize total source to drain resistance | optimize drift region doping to minimize drain depletion region | |

What is claimed is:

1. A method for making a high voltage transistor comprising:

forming a well in a semiconductive substrate, said well having a first impurity concentration level;

forming a drift region in said well, said drift region having a second impurity concentration level which is opposite to said first impurity concentration level, said second impurity concentration level having a value which will result in the formation of a depletion region when an operating voltage is applied which is not substantially larger than needed to withstand a breakdown voltage that said high voltage transistor is designed to withstand;

forming a drain in said drift region such that an extended drain will be formed in said drift region between said drain and said depletion region when said operating voltage is applied to said drain whereby $R_{ds(on)}$ is minimized.

2. The method of claim 1, in which:

said first impurity concentration level is in the range of about 1e15–5e 16/cm³ p-type; and said second impurity concentration is in the range of about 5e16–5e17/cm³ n-type.

3. The method of claim 1, in which:

said first impurity concentration level is about 2e16/cm³ p-type; and said second impurity concentration is about 3e17/cm$^a$ n-type.

4. The method of claim 1, in which:

said first impurity concentration level is in the range of about 1e15–5e 16/cm³ n-type; and said second impurity concentration is in the range of about 1e16–3e17/cm³ p-type.

5. The method of claim 1, in which:

said first impurity concentration level is about 1.5e16/cm³ n-type; and said second impurity concentration is about 8e16/cm$^e$ p-type.

* * * * *